United States Patent
Adams et al.

(10) Patent No.: US 6,884,522 B2
(45) Date of Patent: Apr. 26, 2005

(54) METAL MATRIX COMPOSITE STRUCTURE AND METHOD

(75) Inventors: Richard Adams, Marlboro, MA (US); Grant Bennett, Belmont, MA (US); Kevin Fennessy, New Bedford, MA (US); Robert A. Hay, Dudley, MA (US); Mark Occhionero, Milford, MA (US)

(73) Assignee: Ceramics Process Systems Corp., Chartley, MA (US)

( * ) Notice: Subject to any disclaimer, the term of this patent is extended or adjusted under 35 U.S.C. 154(b) by 23 days.

(21) Appl. No.: 10/124,571

(22) Filed: Apr. 17, 2002

(65) Prior Publication Data

US 2003/0196825 A1 Oct. 23, 2003

(51) Int. Cl.[7] .................. H01L 23/36; B32B 5/22; B32B 5/32; B32B 7/02; B32B 15/20
(52) U.S. Cl. .............. 428/614; 428/550; 428/551; 428/620; 428/621; 428/212; 428/539.5; 174/52.4
(58) Field of Search ................ 428/614, 550, 428/551, 620, 621, 212, 539.5; 174/52.4

(56) References Cited

U.S. PATENT DOCUMENTS

| | | | |
|---|---|---|---|
| 3,547,180 A | 12/1970 | Cochran et al. ............. 164/61 |
| 4,816,347 A | 3/1989 | Rosenthal et al. .......... 428/615 |
| 4,942,076 A | 7/1990 | Panicker et al. ............. 428/137 |
| 4,990,490 A | 2/1991 | Pathare et al. ................. 505/1 |
| 5,039,577 A | 8/1991 | Knoell et al. ................ 428/650 |
| 5,080,934 A | 1/1992 | Naik et al. ................... 427/271 |
| 5,287,248 A | 2/1994 | Montesano ................ 361/708 |
| 5,294,477 A | 3/1994 | Kanba et al. ................ 428/212 |
| 5,296,310 A | 3/1994 | Kibler et al. ................ 428/614 |
| 5,371,043 A | 12/1994 | Anderson et al. ........... 437/209 |
| 5,421,087 A * | 6/1995 | Newkirk et al. ............. 29/897.2 |
| 5,458,480 A * | 10/1995 | Newkirk et al. ............. 425/547 |
| 5,532,513 A | 7/1996 | Smith et al. ................. 257/703 |
| 5,549,151 A * | 8/1996 | Yang ............................. 164/97 |
| 5,618,635 A * | 4/1997 | Newkirk et al. ............. 428/614 |
| 5,639,531 A | 6/1997 | Chen et al. .................... 428/49 |
| 5,657,811 A | 8/1997 | Cook ............................ 164/97 |
| 5,664,616 A * | 9/1997 | Gegel ........................... 164/97 |
| 5,746,387 A | 5/1998 | Pretto et al. .............. 242/571.2 |
| 5,838,063 A | 11/1998 | Sylvester ..................... 257/704 |
| 5,868,887 A * | 2/1999 | Sylvester et al. ............ 156/150 |
| 5,944,097 A | 8/1999 | Gungor et al. .............. 165/185 |
| 5,958,572 A | 9/1999 | Schmidt et al. ........... 428/320.2 |
| 5,983,974 A | 11/1999 | Sylvester ..................... 164/97 |
| 6,003,221 A * | 12/1999 | Sawtell et al. ............. 29/527.6 |
| 6,037,066 A | 3/2000 | Kuwabara ................... 428/610 |
| 6,595,264 B1 * | 7/2003 | Lutz-Nivet et al. .......... 164/98 |

FOREIGN PATENT DOCUMENTS

EP 0 586 758 9/1992

OTHER PUBLICATIONS

Blucher, Joseph, "Discussion of a Liquid Metal Pressure Infiltration Process to Produce Metal Matrix Composites", *Journal of Materials Processing Technology*, 30: 381–390, 1992.

Masur, et al., "Infiltration of Fibrous Preforms by a Pure Metal: Part II. Experiment", *Metallurgical Transactions*, 20A: 2549–2557, 1989.

Mortensen, et al., "Pressure–Infiltration Processing of Reinforced Aluminum", *JOM*, 36–63, 1993.

(Continued)

Primary Examiner—Deborah Jones
Assistant Examiner—Jason L Savage
(74) Attorney, Agent, or Firm—Choate, Hall & Stewart

(57) ABSTRACT

Compound preforms are provided having a first region, including a porous ceramic and a second region including a porous or solid ceramic in which the two regions differ in composition. The compound preform is infiltrated with a liquid metal which is then solidified to form a metal matrix composite.

11 Claims, 1 Drawing Sheet

OTHER PUBLICATIONS

Mortensen, et al., "Solidification Processing of Metal–Matrix Composites", *Journal of Metals*, 12–19, 1988.

Nourbakhsh, et al., "An Apparatus for Pressure Casting of Fibre–Reinforced High–Temperature Metal–Matrix Composites", *J. Phys. E. Sci. Instrument*, 21:898–902, 1989.

Premkumar, et al., "Aluminum Composite Materials for Multichip Modules", *JOM*, 24–28, 1992.

Romero, et al., "Development of Metal Matrix Composite Baseplate Technology for High Current Power Moedules", *ISHM Proceedings*, 421–426, 1994.

Roudier, P., "Mechanical Properties of Cast Pure and Alloyed Aluminum Reinforced with a High Volume Fraction of Carbide Particles", 2–3, 1989.

* cited by examiner

US 6,884,522 B2

METAL MATRIX COMPOSITE STRUCTURE AND METHOD

BACKGROUND OF THE INVENTION

This invention relates to metal matrix composites and methods of manufacturing, and more particularly, to a metal matrix composite having at least two regions that differ in composition.

Metal matrix composites are well-known materials that typically include a discontinuous particulate reinforcement phase within a continuous metal phase. An example is aluminum silicon carbide, AlSiC, which is made by infiltrating a porous, silicon carbide preform with molten aluminum.

The AlSiC metal matrix composite system has the positive attributes of high thermal conductivity, low coefficient of thermal expansion, and is lightweight. These attributes render AlSiC metal matrix composites suitable as a housing or substrate for containing or supporting electronic devices such as integrated circuit chips for which thermal conduction, coefficient of thermal expansion (CTE), and mechanical design features are important.

A negative attribute of AlSiC metal matrix composite is that it is difficult to machine via conventional milling processes because of its hardness. The milling of this material requires diamond tooling and smaller features cannot be machined because of the unavailability of small diamond milling tools. Additionally, some applications would require different coefficients of thermal expansion at different regions within or on a single, integral component. For example, some electronic devices need to be mounted on substrates with high CTE and others to substrates with low CTE. As another example, there might be a sandwich construction having a low CTE device such as an IC on one side, a high CTE substrate, such as organic board on the other side with an intermediate interlayer between them. Yet another structure is a lid covering both an IC and a substrate and is in interfacial contact with both. Previously, these needs would require separate substrates, or performance tradeoffs for a single composition component structure.

The prior art comprehended structures with a single metal matrix composite composition within a given structure that might incorporate secondary components such as substrates, seal lips, and feed-throughs. The prior art does not, however, disclose a single, integral composite component having regions with different properties.

SUMMARY OF THE INVENTION

In one aspect, a method of the invention for forming a metal matrix composite includes providing a compound preform having a first region comprising a porous material and a second region comprising a porous or solid material in which the two regions differ in composition. The compound preform is infiltrated with a liquid metal, and the metal is solidified to form a metal matrix composite. In a preferred embodiment of the method, a first preform comprising a porous ceramic is formed, the first preform defining one or more regions or cavities. The one or more regions or cavities are filled with a second preform comprising a porous or solid material, the second preform differing from the first preform in composition.

In another aspect, the invention is a metal matrix composite having at least a first and a second region wherein each of the regions comprise a porous ceramic infiltrated with a metal matrix, the porous ceramic of the first region and the porous ceramic of the second region differing in at least one of composition and volume fraction.

In yet another aspect, the invention is a lid or carrier for an integrated circuit comprising a metal matrix composite including a ceramic preform infiltrated with a metal matrix. The composite comprises at least one region having a substantially higher thermal conductivity than the surrounding composite. In a preferred embodiment, the metal matrix composite is selected to have a coefficient of thermal expansion matched to or compatible with the coefficient of thermal expansion of the integrated circuit or supporting substrate. A compatible CTE is one selected to reduce stress sufficiently to avoid failure. A suitable preform material is a composition of silicon carbide. Alternatively, the preform can consist of other ceramic materials such as AlN or of different metals, such as Mo, Ti, W, or various steels in powder form. Other suitable preforms contemplated by the present invention include various forms of carbon such as pyrolytic graphite, carbon fiber, or chemical vapor deposited (CVD) diamond or cemented diamond. As used herein, the term preform includes a porous or solid material.

The present invention allows a single, integral composite component to be made which has different properties in different areas. For example, an area that needs post-production machining can be made of a composite having a hardness that allows it to be more readily machined. Additionally, a component can be made having surfaces with different coefficients of thermal expansion so that secure attachments may be made to substrates having different thermal expansion characteristics. Further, components can be made incorporating regions of enhanced thermal conductivity in a high conductivity body.

DESCRIPTION OF THE PREFERRED EMBODIMENT

The assignee of this application fabricates metal matrix composites by first forming a particulate preform structure by an injection molding process. That is, a slurry of ceramic particles such as silicon carbide particles along with solvents and binders is injected into a mold maintained at a low temperature. The preform is removed from the mold then freeze-dried. A typical preform may have approximately 63 volume % particulates with the remainder open space. This SiC preform is then loaded into an infiltration tooling cavity and infiltrated with a liquid metal such as aluminum to completely impregnate the void space within the preform. The liquid metal is solidified and the result is the desired metal matrix composite in which SiC is the discontinuous particulate reinforcement and the aluminum metal forms a continuous matrix.

According to the present invention, more than one composition of preform is loaded into the infiltration tooling cavity followed by infiltration and solidification of metal phase into a single structure with a continuous metal phase throughout. The second preform composition may also be, for example, SiC, but at a different volume percent of particulates, for example, 10–15% on the low side up to approximately 75% SiC. The resulting metal matrix composite will have two or more different SiC compositions within the single entity in different regions.

Alternatively, the second preform can comprise a ceramic material different from that which constitutes the first preform. A different ceramic material may be, for example, AlN. The second preform could also be made of powdered metals such as Mo, Ti, W, or various steels. Yet another possibility is that the second preform be a metal matrix composite itself and placed into the infiltration tooling along with a first porous preform. The preforms are then cast with a metal matrix producing discontinuously reinforced composites in which more than one discontinuous phase composition may exist along with more than one metal matrix composition. As an example, the second metal matrix might be copper, wherein the first metal matrix might be aluminum.

Figure 1:
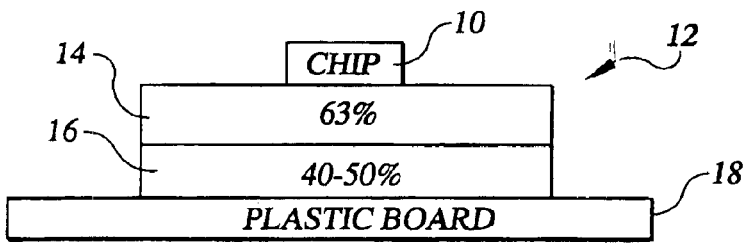
FIG. 1 is a schematic illustration of an embodiment of the invention having surfaces with different coefficients of thermal expansion.

An example structure according to the invention is shown in FIG. 1. A chip such as a microprocessor 10 is supported on a unitary structure 12 that includes first and second regions 14 and 16, respectively. The unitary structure 12 itself rests on a plastic board substrate 18. The first region 14 is an aluminum silicon carbide metal matrix composite in which the silicon carbide makes up approximately 63% of the material. Such a material has a coefficient of thermal expansion of approximately 9 in a temperature range of 30–200° C. The second region 16 has silicon carbide solids in the range of 40–50% resulting in a coefficient of thermal expansion in the range of 10–12, also for the temperature range 30–200° C. The plastic board 18 has a typical coefficient of thermal expansion of 15, whereas the chip 10 has a CTE in the range of 4–6. Therefore, the CTE of the region 14 more nearly matches that of the chip 10 and the CTE of the second region 16 more nearly matches the CTE of the plastic board 18. As described above, the unitary structure 12 is made by forming two different preforms having the different volume % of particulates and placing them into the infiltration tooling for infiltration to create one body with a continuous metal matrix.

Figure 2:
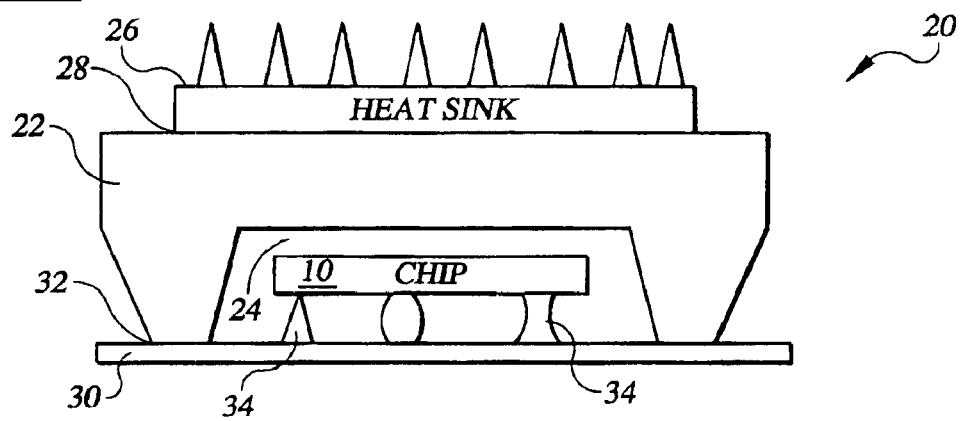
FIG. 2 is a cross-sectional view of a typical prior art chip assembly.

A typical prior art chip assembly 20 is shown in FIG. 2. The chip 10 is attached to a metal matrix composite lid 22 through a thermal attachment material 24. Similarly, a heat sink 26 is attached to the lid 22 through a thermal attachment 28. Lid 22 is affixed to a PCB or ceramic substrate 30 with epoxy or solder 32. The chip 10 is supported by underfill 34. As will be described below, the prior art assembly 20 is improved upon by the present invention.

Figure 3:
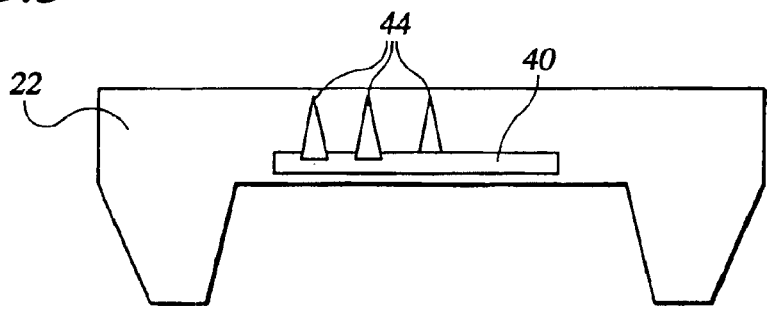
FIG. 3 is a cross-sectional view of another embodiment of the invention.

With reference to FIG. 3, the metal matrix composite lid 22 includes a region 40 which has a different composition from the rest of the lid 22. For example, the lid 22 may be, for the most part, AlSiC whereas the region 40 might be a different composite or monolithic body. For example, the region 40 may itself be a metal matrix composite of, for example, copper and diamond. Alternatively, the region 40 might be a monolithic body such as pyrolytic graphite (PG), carbon fiber, or a multifilament tow. The materials forming the region 40 would form a preform within the preform forming the bulk of the lid 22. This composite preform would then be infiltrated with, for example, liquid aluminum. The region 40 can be tailored to provide a desired property such as enhanced thermal conductivity from the chip 10 through the lid 22 and into the heat sink 26. Experimental studies have shown that a lid 22 with pyrolytic graphite forming the region 40 can significantly reduce the operating temperature of the chip 10 because of the enhanced thermal conductivity of pyrolytic graphite.

Those skilled in the art will appreciate that the embodiment illustrated in FIG. 3 is quite general so that the infiltrating metal might be, for example, aluminum or copper. The reinforcement material in the region 40 may include inserts such as pyrolytic graphite, carbon fiber, or diamond (CVD or cemented), which is surrounded by AlSiC in the cast body. It is contemplated that the insert can fill the entire cross-sectional thickness of the lid 22 or only partially fill it, i.e., 0.020 inch thick diamond insert in a 0.050 inch cross-section thickness lid. Carbon fiber and pyrolytic graphite materials are anisotropic in their thermal conduction, and therefore, insert geometry and orientation are selected as desired. Heat pipes or phase change materials (PCM) can also be used in the region 40. It is also contemplated to fabricate an integrated heat sink into the lid 22. For example, diamond spikes 44 could protrude into pyrolytic graphite in the region 40 and extend through the lid 22. In this embodiment, the diamond spikes 44 provide a high thermal conductivity path through the thickness of the pyrolytic graphite material, which itself has low thermal conductivity in the thickness direction.

The inserts in the region 40 of FIG. 3 can result in much higher thermal conductivity, possibly more than double that of copper. Thermal expansion coefficient can also be more closely matched to the lid and substrate. While costs may be higher, this disadvantage is likely to be offset by marked increase in performance.

Figure 4:
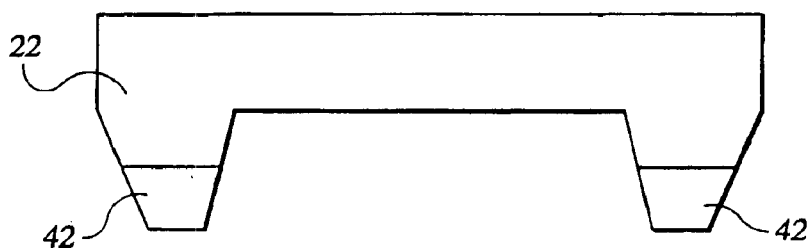
FIG. 4 is a cross-sectional view of yet another embodiment of the invention.

Yet another embodiment of the invention is shown in FIG. 4. In this embodiment, the lid 22 is, for example, primarily AlSiC, but with a region 42 that is a different composite such as aluminum molybdenum. The structure in FIG. 4 is made by preparing appropriate preforms of SiC and Mo and infiltrating with aluminum. The Al—Mo regions 42 are more readily machinable than is the aluminum silicon carbide making up the remainder of the lid 22.

With reference again to FIG. 2, the thermal attachments 24 and 28 are often a thermal grease to prevent any air gaps. To improve thermal conduction manufacturers might ideally directly attach the integrated circuit chip to the AlSiC lid 22. For example, gallium arsenide or Si chips can be directly attached using a gold-tin solder. In this case, the AlSiC is nickel-plated and gold flashed. Oftentimes a lead-tin solder is used, but any low temperature solder over the range 50–400° C. such as gold-tin is suitable. A lead-tin solder wets directly to a flame sprayed "Babbitt" coating. The "Babbitt" coating is 0.0005–0.0015 inch thick and is comprised of 88% Sn, 8% Sb, and 4% Cu. This coating has a solidus of 230° C. and liquidus of 354° C. and is sprayed over a flame-sprayed layer of Cu of 0.001–0.002 inch thickness. The attractive aspect of flame-sprayed coatings is low cost relative to plating. Flame-sprayed nickel may be compatible directly with a gold-tin solder attachment.

The table below presents other contemplated lid structures.

TABLE

Lid Composites

| Parameter | Option 1 | Option 2 | Option 3 | Option 4 | Option 5 | Option 6 | Option 7 | Option 8 |
|---|---|---|---|---|---|---|---|---|
| Matrix Metal | Al | Cu | | | | | | |
| Reinforcement Material | SiCp PG plate insert (PG: $K_{xy}$ = 1700 W/mK, $K_z$ = 10 W/mK) | SiCp + PG plate insert (PG: $K_{xy}$ = 600–800, K =? Z Axis) | SiCp + 2D C-Fiber insert (Fiber: K = 600–1200 W/mK Grade dependent) | SiCp + 3D C-Fiber Insert (Fiber: K = 600–1200 W/mK Grade dependent) | SiCp + C-Fiber Multifilament Tow (Fiber: K = 600–1200 W/mK Grade dependent) | SiCp + CVD Diamond plate insert (Fiber: K = 1000 W/mK or SiC Plate Coated w/CVD Diamond, $K_{xy}$ = 500, $K_z$ = 150–200 | Cubic Boron Nitride Particulates (CBN: K = 600 W/mK? Isotropic) | SiCp + POCO Porous Graphite Foam insert (Foam: K = 1800 W/mK estimated bulk value: foam porosity = 70% Material plug of lid shape foam insert |
| Reinforcement Geometry | Solid 2D Plate/Fabric | Plate/Fabric with Metal Thermal Pipes | Plate/Fabric/ Paper Orientation Options | Coil of Multifilament Tow | Plugs of Multifilament Tow | | | |
| Heat Pipes/ PCM | Capture Miniature Spiral Tube- attach condenser to side | Capture Miniature Spiral Tube- fill with PCM | PCM filled cavity | | | | | |
| Coatings | Ni Plate | Ni + Au Flash | Flame Sprayed Ni | Flame Sprayed Babbitt | | | | |
| Lid Geometry | Thicker Lid | | | | | | | |

Note:
SiCp = SiC particulates
Kxy = Thermal Conductivity in X-Y Plane
Kz = Thermal Conductivity in Z Plane The values in the Table are merely representative and may vary as will be appreciated by those skilled in the art. In Option 1, for instance, $K_{xy}$ could be in the range of 800–2000 W/mK.

It is recognized that modifications and variations of the present invention will occur to those skilled in the art, and it is intended that all such modifications and variations be included within the scope of the appended claims.

What is claimed is:

1. A method of forming a metal matrix composite, comprising:
   providing a compound preform, comprising a first region comprising a first porous material and a second region comprising a second porous material, wherein the two regions differ in material composition;
   infiltrating the compound preform with a liquid metal; and
   solidifying the metal to form a metal matrix composite, wherein regions in the composite have different thermal conductivities.

2. A method of forming a metal matrix composite, comprising:
   providing a compound preform having a volume percent of particulates in the range of 10%–75%, comprising a first layer comprising a first porous material and a second layer comprising a second porous material, wherein the two layers differ in volume percent of particulates;
   infiltrating the compound preform with a liquid metal; and
   solidifying the metal to form a metal matrix composite, wherein layers in the composite have different thermal conductivities.

3. A method of forming a metal matrix composite, comprising:
   providing a compound preform, comprising a first region comprising a porous material and a second region comprising a material having a thermal conductivity of about 400 W/mK or greater, wherein the two regions differ in material composition;
   infiltrating the compound preform with a liquid metal; and
   solidifying the metal to form a metal matrix composite, wherein regions in the composite have different thermal conductivities.

4. The method of claim 3, wherein the material having a thermal conductivity of 400 W/mK or greater is selected from copper, pyrolytic graphite, carbon fiber, diamond, and cubic boron nitride.

5. The method of claim 1, claim 2, or claim 3, wherein providing the compound preform comprises:
   forming a first preform comprising a porous material, the first preform defining one or more cavities; and
   filling the one or more cavities with a second preform comprising a porous or solid material.

6. A metal matrix composite comprising:
   a first region and a second region, wherein each of the regions comprises a porous ceramic infiltrated with a metal matrix, the porous ceramic of the first region and the porous ceramic of the second region differing in material composition, wherein the regions in the composite have different thermal conductivities.

7. A metal matrix composite comprising:
   a first layer and a second layer, wherein each of the layers comprises a porous ceramic having a volume percent of particulates in the range of 10%–75% infiltrated with a metal matrix, the porous ceramic of the first layer and the porous ceramic of the second layer differing in volume percent of particulates, wherein the layers in the composite have different thermal conductivities.

8. The metal matrix composite of claim 6 or claim 7 wherein the metal matrix composite has a coefficient of thermal expansion compatible with the coefficient of thermal expansion of an integrated circuit.

9. The metal matrix composite of claim 6 or claim 7 adapted to be a lid for an integrated circuit such as an ASIC, DSP, or microprocessor.

10. A metal matrix composite comprising:
a first region and a second region, wherein the first region comprises a porous ceramic infiltrated with a metal matrix, and the second region comprises a material having a thermal conductivity of about 400 W/mK or greater, wherein the materials of the first region and the material of the second region differ in material composition, and wherein the regions in the composite have different thermal conductivities.

11. The composite of claim 10, wherein the material having a thermal conductivity of 400 W/mK or greater is selected from copper, pyrolytic graphite, carbon fiber, diamond, and cubic boron nitride.

* * * * *